United States Patent [19]

Ruehl et al.

[11] Patent Number: 4,527,312
[45] Date of Patent: Jul. 9, 1985

[54] STACKABLE HINGING PRINTED CIRCUIT BOARD SUPPORT

[75] Inventors: William E. Ruehl, Wheeling; Joseph P. DeMarco, Park Ridge, both of Ill.

[73] Assignee: Illinois Tool Works Inc., Chicago, Ill.

[21] Appl. No.: 524,679

[22] Filed: Aug. 19, 1983

[51] Int. Cl.³ .......................... H05K 7/12; F16B 5/06
[52] U.S. Cl. ........................................ 24/453; 24/297;
24/305; 24/336; 24/458; 174/138 D; 361/412;
411/508
[58] Field of Search ................. 174/138 D; 361/412,
361/419, 420; 24/297, 305, 335, 336, 453, 458,
573; 248/201, 500; 267/141; 411/508, 548, 908

[56] References Cited

U.S. PATENT DOCUMENTS

| | | | |
|---|---|---|---|
| 3,651,545 | 3/1972 | Hara | 174/138 D X |
| 3,836,703 | 9/1974 | Coules | 174/138 D |
| 4,162,560 | 7/1979 | Thomsen | 24/305 |
| 4,430,776 | 2/1984 | Shimizu et al. | 174/138 D X |
| 4,495,548 | 1/1985 | Matsui | 174/138 D X |

FOREIGN PATENT DOCUMENTS

| | | | |
|---|---|---|---|
| 51-39095 | 9/1976 | Japan | 174/138 D |
| 1061664 | 3/1967 | United Kingdom | 174/138 D |

Primary Examiner—Laramie E. Askin
Attorney, Agent, or Firm—J. R. Halvorsen; T. W. Buckman

[57] ABSTRACT

A stackable hinging printed circuit board support is provided, comprising an integral plastic molding. The support is provided with an intermediate notch and an adjacent wall section which is sufficiently thin as to permit flexing for pivoting of one printed circuit board away from another. The support has an upstanding circular segment pilot for fitting in a circular aperture of an overlying printed circuit board. The support has at its bottom a W prong structure dimensioned for insertion in a circular aperture of a printed circuit board so as to coact with the upstanding circular segment pilot of an underlying support to wedge the pilot in the aperture. The W prong of one support is received in a recess provided in the body of a subjacent support.

3 Claims, 3 Drawing Figures

STACKABLE HINGING PRINTED CIRCUIT BOARD SUPPORT

BACKGROUND OF THE INVENTION

In the mounting of panels, and particularly of printed circuit boards, it is often necessary or desirable to stack such printed circuit boards or panels one above the other in spaced relation. The panels, and particularly printed circuit boards, should be insulated from one another. Structure used for effecting the stacking should be detachable to permit repair or replacement of the panels or boards, and in some instances it is necessary to pivot the panels or boards for access. U.S. Pat. Nos. 3,836,703 and 4,162,560, and Japanese Utility Model patent 51-39095 disclose various forms of plastic devices for stacking panels or printed circuit boards. U.S. Pat. No. 3,651,545 is similar and in one embodiment also discloses pivoting or hinging of a panel.

SUMMARY AND OBJECTS OF THE PRESENT INVENTION

It is an object of the present invention to provide an integral and stackable hinged printed circuit board support for detachably stacking printed circuit boards, and for permitting pivotal or hinged movement of one or more of such boards.

In attaining the foregoing and other and further more detailed objects of the present invention there is provided an integral plastic member having at the lower end thereof a snap-in device of the type having re-entrant barbs, generally known as a W prong, for insertion through an aperture in a printed circuit board. At the top end the member is provided with an extension or pin in the form of a circular segment for fitting in an overlying printed circuit board. A lateral and longitudinally extending arm adjacent the upper end has a releasable latch member thereon for securing an apertured printed circuit board over the upstanding pin. At an intermediate position the member is provided with a notch having a flexible hinge so that one or more printed circuit boards can be pivoted away from other printed circuit boards.

THE DRAWINGS

The present invention will best be understood from the following specification taken in connection with the accompanying drawings wherein.

DETAILED DESCRIPTION OF THE ILLUSTRATED EMBODIMENT

Figure 1:
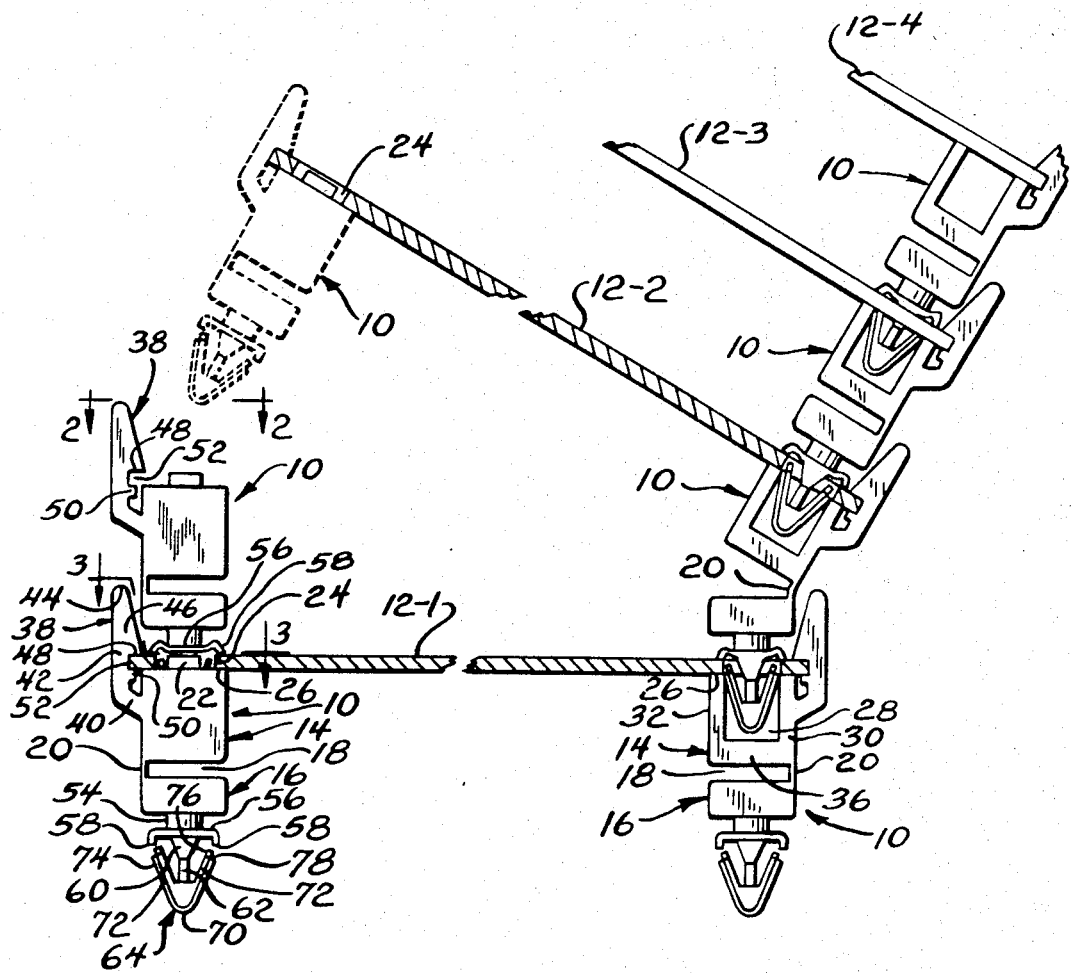
FIG. 1 is a side view of a plurality of printed circuit board supports constructed in accordance with the present invention, associated printed circuit boards being shown in cross-section.

Turning now in greater particularity to the figures, there is shown a plurality of stackable hinging printed circuit board supports 10 constructed in accordance with the principles of the present invention. All of these supports are identical, and reference is made particularly to the two lower ones for a more detailed description, reference being made to the two since they are in relatively reversed position. A plurality of printed circuit boards 12-1, 12-2, 12-3 and 12-4 is shown in spaced-apart stacked relationship as mounted by the supports 10. The top three printed circuit boards and the associated supports are shown in hinged position to illustrate the hinging feature of the support.

Each support includes an upper body 14 and a lower body 16 spaced apart vertically by a notch 18 and secured together by a vertical strip 20 along the outer edge. Each support is molded of a suitable plastic resin material, nylon being a preferred example. The inherent resiliency of such material in the narrow strip 20 allows this strip to serve as a hinge.

Figure 2:
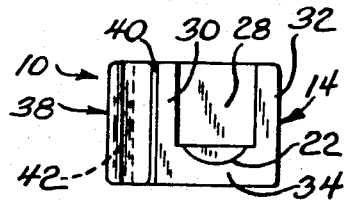
FIG. 2 is an end view of one such support as taken substantially along the line 2—2 in FIG. 1.
Figure 3:
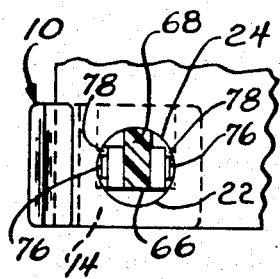
FIG. 3 is a view partly in cross-section as taken substantially along the line 3—3 in FIG. 1.

Both body portions 14 and 16 are of square cross-section, this shape of the upper body portion 14 being visable in FIGS. 2 and 3. A circular segment pilot 22 extends upwardly from the top edge of the upper body 14, and will be seen in FIG. 3 as occupying only a small segment of the circular aperture 24 adjacent the edge of the printed circuit board 12-1. The remainder of the area of the circular aperture 24 will be discussed hereinafter with regard to underlying parts of the support 10.

The upper body 14 is provided with an upper surface 26, and a recess 28 opens upwardly through this surface, and also laterally, the recess being defined by sidewalls 30 and 32, and a thicker rear wall 34 of the upper body 14. A bottom wall 36 lies between the recess 28 and the notch 18.

The support is provided with a panel or board supporting arm 38 extending outwardly and upwardly from the upper body 14. The arm is integral with the adjacent wall 30 and is of the same width or front to back distance thereas and comprises a diagonal portion 40 joined to the wall 30 and a subsequent upstanding portion 42 with a rounded upper edge 44. A tapered wedge portion 46 lies on the inner face of the upstanding portion 42 downwardly from the rounded edge 44 and provides a lower shoulder 48. A stub wall 50 is spaced down from the shoulder 48, leaving a notch 52 therebetween of proper size to receive the edge of the printed circuit board 12-1 adjacent the circular aperture 24 therein. The cross-sections of the arm 38 are sufficiently large that the arm is substantially rigid with the upper body 14, flexing only very slightly to allow assembly with a printed circuit board 12-1.

A cylindrical post 54 extends downwardly a short distance from the bottom of the lower body 16 and is provided at its lower end with a shallow circular transverse plate 56. This plate is provided with downturned flanges 58 at two diametrically opposite positions. The flanges impinge against the top edge of a printed circuit board 12-1 in the vicinity of the aperture 24 and cause the outer edges of the plate to deflect somewhat upwardly as viewed at the lower left corner of FIG. 1 in connection with printed circuit board 12-1.

Beneath the plate 56 there is a tapered projection 60 leading to a flat stem 62 forming the center member of a W prong 64. The tapered projection 60 at right angles to the view afforded in FIG. 1 is restricted at one side 66 (FIG. 3), but is extended and rounded at the opposite side 68.

The W prong 64 is rounded at its lower end at 70, and has two outwardly diverging arms 72 extending upwardly therefrom. These arms are of the same transverse width (perpendicular to the showing in FIG. 1) as the stem 62 and extend upwardly into close proximity to the flanges 58, the arms having a rounded outer surface 74. A restricted tongue 76 extends upwardly beyond the upper edge or shoulder 78 of each arm 72.

In use, as illustrated in FIG. 1, the W prong 64 of one support 10 is received within the recess 28 of an underlying support 10, except, of course, in the case of the lowest support. The upper ends 78 of the diverging arms 72 abut the underside of the printed circuit board 12-1 adjacent the aperture 24 with the extending tongues 76 projecting up into the respective aperture 24, whereby to resist upward movement of the support in the underlying printed circuit board 12-1.

In the case of each support other than the lowest, the restricted side 66 of the tapered projection 60 abuts the adjacent flat face of the circular segment pilot 22, while the rounded projected opposite portion 68 abuts the opposite margin of the aperture 24. This secures the pilot 22 within the aperture 24.

As will be appreciated, a printed circuit board can be removed for servicing by pulling outwardly on the mounting arm 38 of each support 10. It is also possible to release only one edge of a printed circuit board, and to pivot said board upwardly, bending the hinge or pivot section 20 of the underlying support as shown in FIG. 1 in connection with printed circuit board 12-2. In this particular illustration, the underlying support 10 remains attached to the upwardly pivoted edge of the board, the W prong having been released, but it will be understood that the board is more readily released from the arm 38. Release of a W prong from the panel in which it is installed is well known in the art.

The supports in the aggregate are sufficiently rigid to produce a properly spaced and stable stack of panels or printed circuit boards. However, each individual support, due to the thin flexible section 20, provides a certain degree of resilience between panels, and thus provides protection against transmission of possibly injurious mechanical shocks.

The illustrated embodiment of the present invention will be understood as being exemplary only. Various changes in structure will no doubt occur to those skilled in the art and will be understood as forming a part of the present invention insofar as they fall within the spirit and scope of the appended claims.

The invention is claimed as follows:

1. A one-piece integral panel support of resinous plastic material comprising an upper body and a lower body, said lower body being spaced beneath said upper body and interconnected to said upper body by a thin flexible section providing for shock resistance and forming a hinge for pivoting, means for resiliently fastening said lower body within an opening in a panel and extending below said lower body, said upper body having an upper facing recess, a resilient panel latching arm supported by said upper body above said upper facing recess for holding the edge of a panel, a circular segment pilot upstanding from the upper surface of said upper body adjacent said panel latching arm, and said resiliently fastening means having a slightly smaller transverse dimension than the corresponding transverse dimension of said upper facing recess and having a wedging means for providing a holding force within an opening in a panel.

2. A one-piece integral panel support as defined in claim 1, wherein said resiliently fastening means includes a W-shaped resilient prong and a downwardly extending stem portion integrally formed with the center member of said W-shaped resilient prong.

3. A one-piece integral panel support as defined in claim 2, wherein said wedging means comprises a lateral surface on said stem portion that tapers outwardly in the direction toward said lower body.

* * * * *